United States Patent
Hu et al.

(10) Patent No.: US 7,550,395 B2
(45) Date of Patent: Jun. 23, 2009

(54) CONTROL OF PHOTOELECTROCHEMICAL (PEC) ETCHING BY MODIFICATION OF THE LOCAL ELECTROCHEMICAL POTENTIAL OF THE SEMICONDUCTOR STRUCTURE RELATIVE TO THE ELECTROLYTE

(75) Inventors: Evelyn L. Hu, Goleta, CA (US); Shuji Nakamura, Santa Barbara, CA (US); Elaine D. Haberer, Santa Barbara, CA (US); Rajat Sharma, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 437 days.

(21) Appl. No.: 11/263,314

(22) Filed: Oct. 31, 2005

(65) Prior Publication Data

US 2006/0110926 A1 May 25, 2006

Related U.S. Application Data

(60) Provisional application No. 60/624,308, filed on Nov. 2, 2004.

(51) Int. Cl.
*H01L 21/302* (2006.01)
*H01L 21/461* (2006.01)

(52) U.S. Cl. .................. 438/746; 257/E21.215
(58) Field of Classification Search ............ 438/746; 257/E21.215, E21.216
See application file for complete search history.

(56) References Cited

U.S. PATENT DOCUMENTS

| | | | |
|---|---|---|---|
| 5,773,369 A * | 6/1998 | Hu et al. ............... | 438/746 |
| 5,895,223 A | 4/1999 | Peng et al. | |
| 6,306,672 B1 | 10/2001 | Kim | |
| 6,605,548 B1 | 8/2003 | Bardwell | |
| 7,026,255 B2 * | 4/2006 | Wolff ................... | 438/746 |
| 2003/0045120 A1 | 3/2003 | Hu et al. | |
| 2003/0180980 A1 | 9/2003 | Margalith et al. | |

OTHER PUBLICATIONS

Gao Y. et al: "Al GaN/GaN current aperture vertical electron transistors fabricated by photoelectrochemical wet etching" Electronics Letters, IEE Stevenage, GB, vol. 39, No. 1, Jan. 9, 2003, pp. 148-149.

Haberer E. D. et al: "Removal of thick (> 100 nm) InGaN layers for optical devices using band-gap-selective photoelectrochemical etching" Applied Physics Letters, vol. 85, No. 5, Aug. 2, 2004, pp. 762-764.

Stonas A. R. et al: "Photoelectrochemical undercut etching for fabrication of GaN microelectromechanical systems" Journal of Vacuum Science and Technology. B, Micoelectronics and Nanometer Structures Processing, Measurement and Phenomena, vol. 19, No. 6, Nov. 2001, pp. 2838-2841.

(Continued)

*Primary Examiner*—W. David Coleman
(74) *Attorney, Agent, or Firm*—Gates & Cooper LLP

(57) ABSTRACT

A method for locally controlling an electrical potential of a semiconductor structure or device, and hence locally controlling lateral and/or vertical photoelectrochemical (PEC) etch rates, by appropriate placement of electrically resistive layers or layers that impede electron flow within the semiconductor structure, and/or by positioning a cathode in contact with specific layers of the semiconductor structure during PEC etching.

8 Claims, 14 Drawing Sheets

OTHER PUBLICATIONS

Pearton, S. J.: A review of dry etching of GaN and related materials MRS Internet Journal of Nitride Semiconductor Research, vol. 5, No. 11, Nov. 16, 2000. (Retrieved from the Internet: URL:http://nsr.mij.mrs.org./5/11/complete.html.).

Stonas et al., "Backside-illuminated photoelectrochemical etching for the fabrication of deeply undercut GaN structures," Applied Physics Letters, vol. 77, No. 16, pp. 2610-2612, Oct. 16, 2000.

Stonas et al., "Development of selective lateral photoelectrochemical etching of InGaN/GaN for lift-off applications," Applied Physics Letters, vol. 78, No. 13, pp. 1945-1947, Mar. 26, 2001.

Strittmatter et al., "Fabrication of GaN suspended microstructures," Applied Physics Letters, vol. 78, No. 21, pp. 3226-3228, May 21, 2001.

Youtsey et al., "Dopant-selective photoenhanced wet etching of GaN," Journal of Electronic Materials, vol. 27, No. 4, pp. 282-287, Nov. 4, 1998.

Ben-Yaacov et al., "AlGaN/GaN current aperture vertical electron transistors," Device Research Conference (Cat. No. 02TH8606), IEEE, 2002, pp. 31-32.

Wong et al., "Structural and optical quality of GaN/metal/Si heterostructures fabricated by excimer laser lift-off," Applied Physics Lettes, vol. 75, No. 13, pp. 1887-1889, Sep. 27, 1999.

Wong et al., "Damage-free separation of GaN thin films from sapphire substrates," Applied Physics Letters, vol. 72, No. 5, pp. 599-601, Feb. 2, 1998.

Edwards et al, "InGaN/GaN quantum well microcavities formed by laser lift-off and plasma etching," Wiley-VCH. Physica Status Solidi B-Basic Research, vol. 228, No. 1, pp. 91-94, 2001.

Martin et al., "Optical spectroscopy of GaN microcavities with thicknesses controlled using a plasma etchback," Applied Physics Letters, vol. 79, No. 19, pp. 3029-3031, Nov. 5, 2001.

Martin et al., "GaN microcavities formed by laser lift-off and plasma etching," Materials Science & Engineering B-Solid State Materials for Advanced Technology, vol. B93, pp. 98-101, 2002.

Stonas et al., "Gallium Nitride-Based Micro-Opto-Electro-Mechanical Systems," in Electrical and Computer Engineering Department Santa Barbara: University of California, Santa Barbara, Dec. 2003, pp. 1-132.

* cited by examiner

CONTROL OF PHOTOELECTROCHEMICAL (PEC) ETCHING BY MODIFICATION OF THE LOCAL ELECTROCHEMICAL POTENTIAL OF THE SEMICONDUCTOR STRUCTURE RELATIVE TO THE ELECTROLYTE

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/624,308, filed on Nov. 2, 2004, by Evelyn L. Hu, Shuji Nakamura, Elaine D. Haberer, and Rajat Sharma, entitled "CONTROL OF PHOTOELECTROCHEMICAL (PEC) ETCHING BY MODIFICATION OF THE LOCAL ELECTROCHEMICAL POTENTIAL OF THE SEMICONDUCTOR STRUCTURE RELATIVE TO THE ELECTROLYTE";

which application is incorporated by reference herein.

BACKGROUND OF THE INVENTION

1. Field of the Invention

The present invention relates to the control of photoelectrochemical (PEC) etching by modification of the local electrochemical potential of the semiconductor structure relative to the electrolyte.

2. Description of the Related Art (Note: This application references to various publications as indicated in the specification by reference numbers enclosed in brackets, e.g., [x]. A list of these publications ordered according to these reference numbers can be found below in the section entitled "References". Each of these publications is incorporated by reference herein.)

PEC etching uses above-bandgap illumination to generate carriers (specifically holes) needed to etch III-nitrides. The electrochemical potential of the semiconductor material surface relative to the electrolyte causes holes to be drawn toward the semiconductor-electrolyte interface in n-type (unintentionally-doped or doped) material, allowing them to participate in the electrochemical reactions necessary for material removal. Because the etching mechanism relies heavily on the absorption of incident light and the electrochemical potential of the semiconductor material relative to the electrolyte, PEC etching can be defect-selective, dopant-selective, and bandgap-selective.

Most applications of PEC etching have pertained to vertical etching of the material, either through direct illumination of the material surface, or by illumination through a masking layer. Reports also exist of lateral PEC etching. However, specific descriptions of local control of the etch process through modifications of the electrochemical component of etching have not been presented. Previously published and patented techniques that apply to III-nitride PEC etching [1-10] suffer from certain limitations, which may be encountered individually or simultaneously depending on the particular application considered, as will be discussed below.

In PEC etching of semiconductor multilayer structures, variability can arise from (a) non-uniform illumination of the sample (e.g. via absorption of the incident light), (b) geometry-dependent limitations to the availability of electrolyte (as would characterize the wetting of electrolyte between two very closely spaced layers of material), and (c) carrier diffusion and recombination dynamics that vary strongly with geometry and position of the carriers within a structure. While limitations (a) and (b) are important, we believe that relatively easier solutions of (a) altering illumination directions and conditions and (b) changing electrolyte concentration and flow conditions are more easily implemented. Our invention addresses the last limitation—through strategic tailoring of the local electrochemical potential of the material to be etched.

As will be described in detail in the preferred embodiment, the placement of suitable layers within the semiconductor structure may be used to prevent etching of specific layers. Additionally, the placement of a cathode in contact with a particular layer (or layers) of a semiconductor structure may be used to promote etching of a specific layer (or layers) when desired. A combination of these two approaches may be used, as required for certain applications.

Specifically, prior to this invention, there existed no effective method for fabricating the following semiconductor structures:

1) High-quality nitride-based microdisk resonators, and

2) High-quality vertically oriented nitride-based air-gap distributed Bragg reflector (DBR) structures.

This invention also allows for significant improvements over existing practices in the following nitride-based applications:

1) Electrical and optical apertures in nitride-based electronic and optoelectronic devices: Currently used methods typically employ some form of ion implantation, which may cause unwanted damage to critical layers [11]; or dry etching followed by regrowth, which is an elaborate and cumbersome process [12]. In recent years, PEC etching has been used to create current apertures in electrical devices [1]; however, due to the lack of etch control, the material composition of the undercut layers is highly restricted. Thus, possible device designs for these geometries are limited.

2) Substrate removal and cavity thinning: Currently, the commonly used methods include laser-assisted debonding [13, 14] and inductively coupled plasma (ICP) etching [15-17] or polishing, respectively. These methods are cumbersome, and typically result in relatively imprecise material thicknesses.

3) Semiconductor membranes and cantilevers: Currently, PEC etching is used to create undercut structures such as membranes and cantilevers in the nitride material system [3, 5, 7, 18]; however, due to the lack of etch control, the material composition of the undercut layers is highly restricted [18]. Therefore, possible designs for undercut devices such as micro-electro-mechanical systems (MEMS) and photonic crystals are extremely limited.

SUMMARY OF THE INVENTION

This invention describes a scheme for fabricating III-nitride semiconductor structures wherein a highly selective photo-induced etch is achieved through strategic modification of the local electrochemical potential of the semiconductor structure relative to the electrolyte. This is accomplished through:

1) The suitable placement of electrically resistive (unintentionally-doped, doped, alloyed) or electron-blocking layers in the semiconductor structure.

2) The selective placement of the cathode in PEC etching, wherein the cathode acts as a "channel" for the controlled collection of photo-generated electrons from the semiconductor layers with which it is in contact.

3) The use of a suitable light source during PEC etching, which enables the photo-generation of electrons and holes in layers with bandgap energies lower than the energy of the incident light. The etch will not proceed without photo-induced carriers. The light source may be a laser or a broad-spectrum source with/without a filter.

4) The use of a suitable electrolyte solution during PEC etching, wherein the concentration and type of electrolyte determines the etch rate and etch selectivity.

PEC etching is a photo-induced etch process in which only layers that contain photo-generated carriers may be susceptible to etching. Although several reports exist of etching induced by the photoelectrochemical process, specific descriptions of local control of the etch process through modifications of the electrochemical component of the etching have not been provided. In general, control of the PEC etch process can be achieved through variation of wavelength, duration, and intensity of the incident illumination, composition and concentration of the electrolyte and strategic modification of the electrical potential of the structure relative to the electrolyte. This invention describes a method to locally control the electrical potential of a structure or device (and hence locally control lateral and/or vertical PEC etch rates) by appropriate placement of electrically resistive layers or layers that impede electron flow within the semiconductor structure, and/or by positioning the cathode in contact with specific layers of the semiconductor structure during PEC etching. This invention may thus be used to our advantage to fabricate several structures of interest, including but not limited to microdisk resonators, air-gap DBRs, semiconductor membranes, and electrical and optical apertures, as well as for specific techniques of interest, including but not limited to substrate removal.

BRIEF DESCRIPTION OF THE DRAWINGS

Referring now to the drawings in which like reference numbers represent corresponding parts throughout.

DETAILED DESCRIPTION OF THE INVENTION

Figure 1:
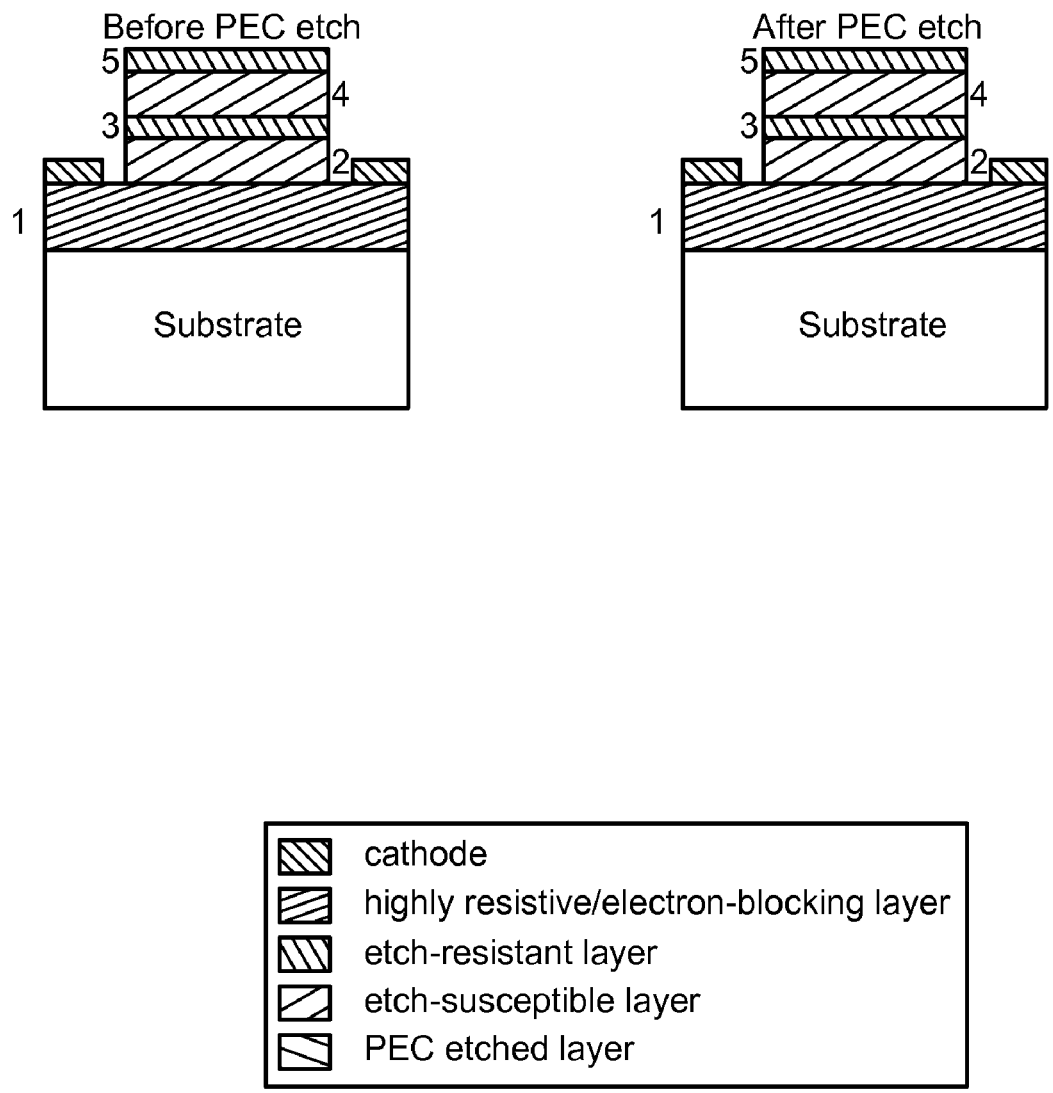
FIGS. 1-8 illustrate several example structures and their resulting etch profiles in cross-sectional schematic views.
Figure 2:
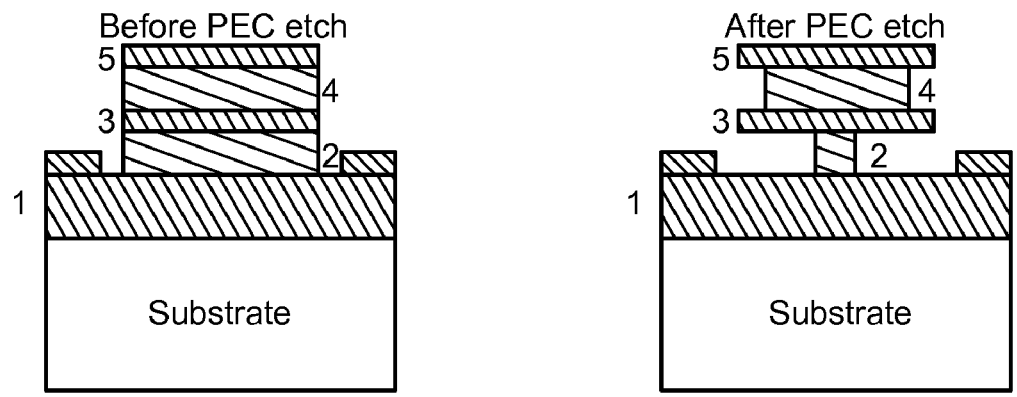
Figure 2:
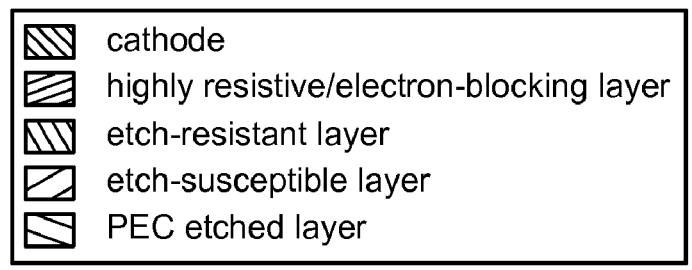
Figure 3:
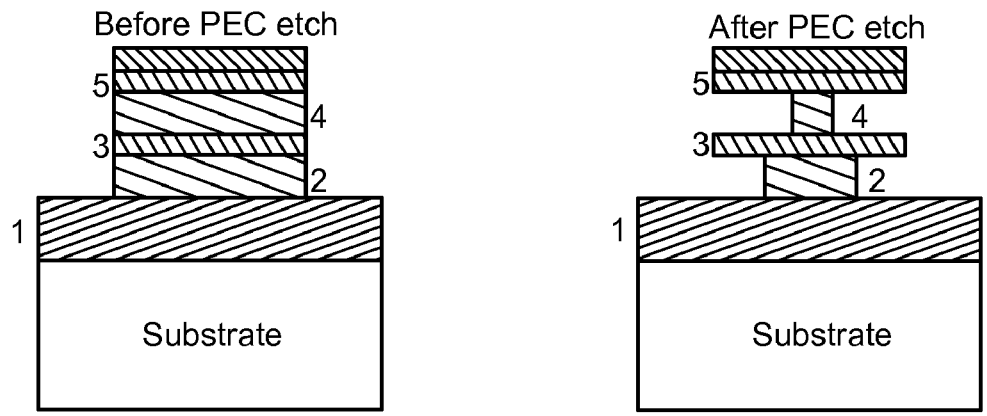
Figure 3:
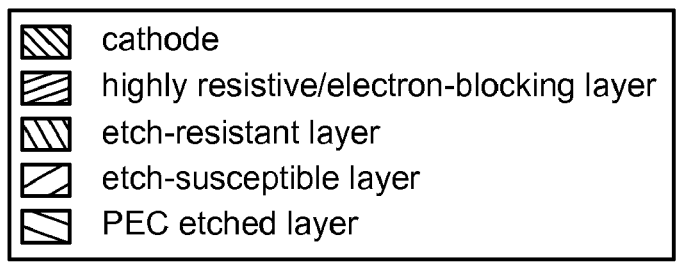
Figure 4:
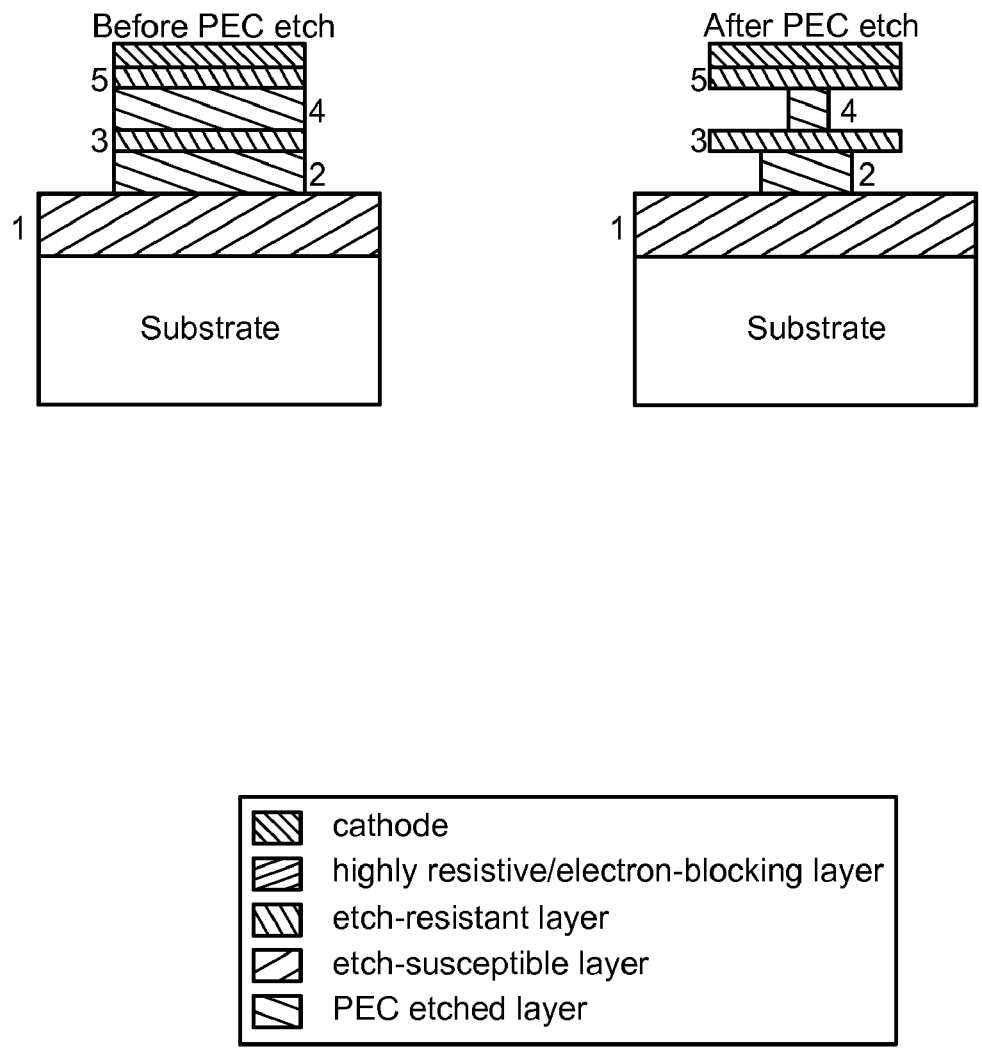
Figure 5:
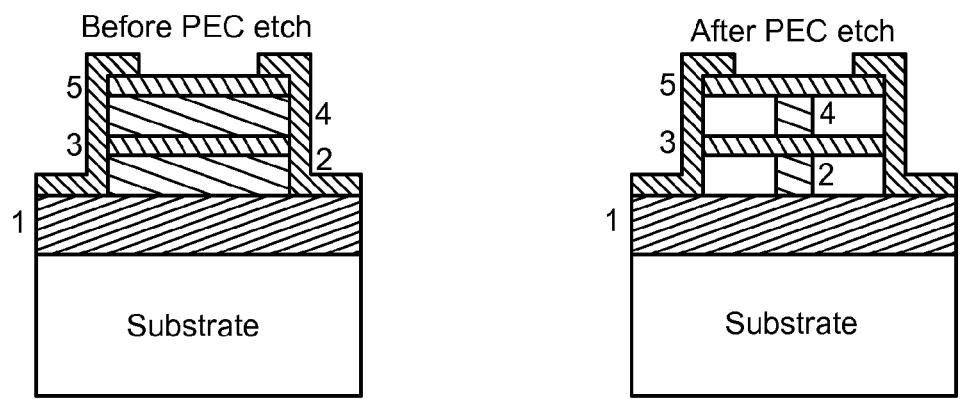
Figure 5:
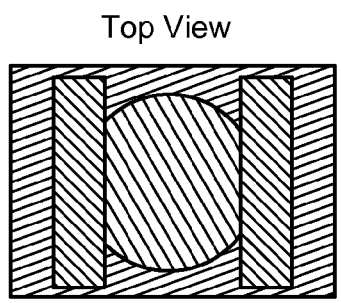
Figure 5:
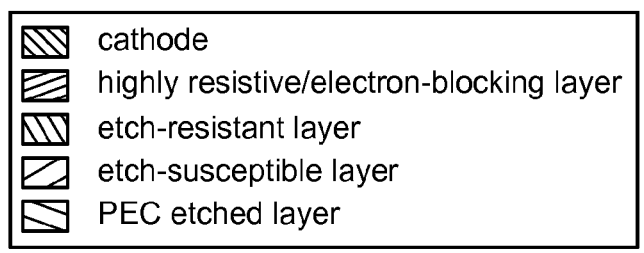
Figure 6:
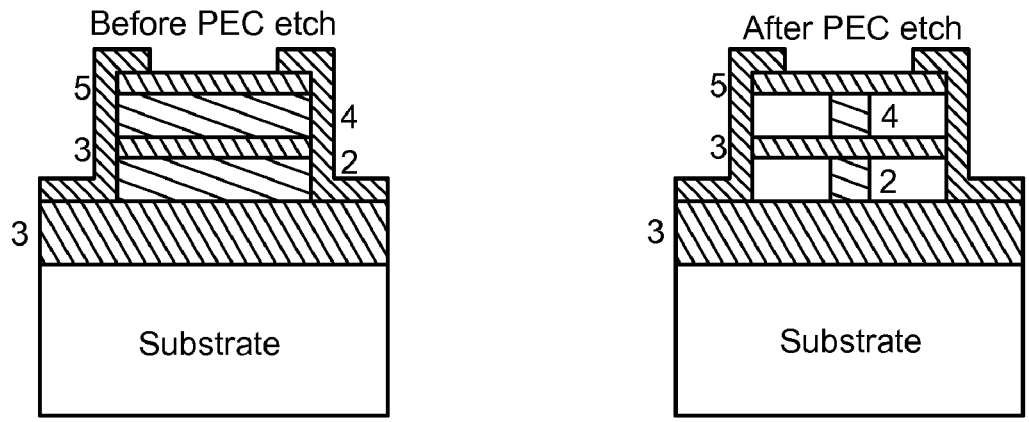
Figure 6:
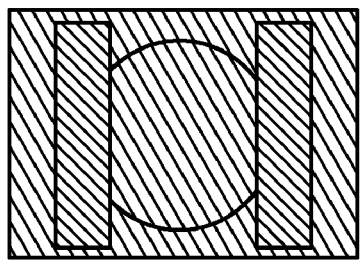
Figure 6:
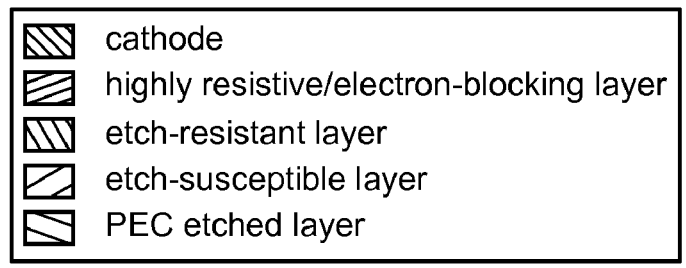
Figure 7:
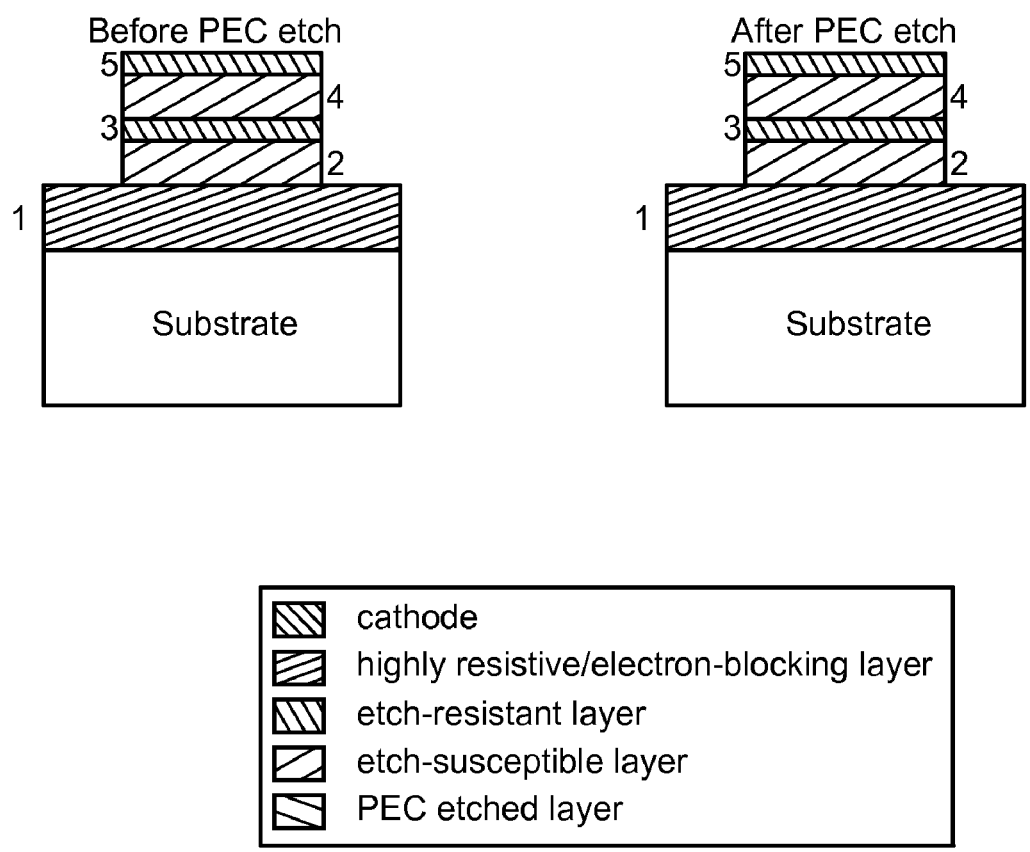
Figure 8:
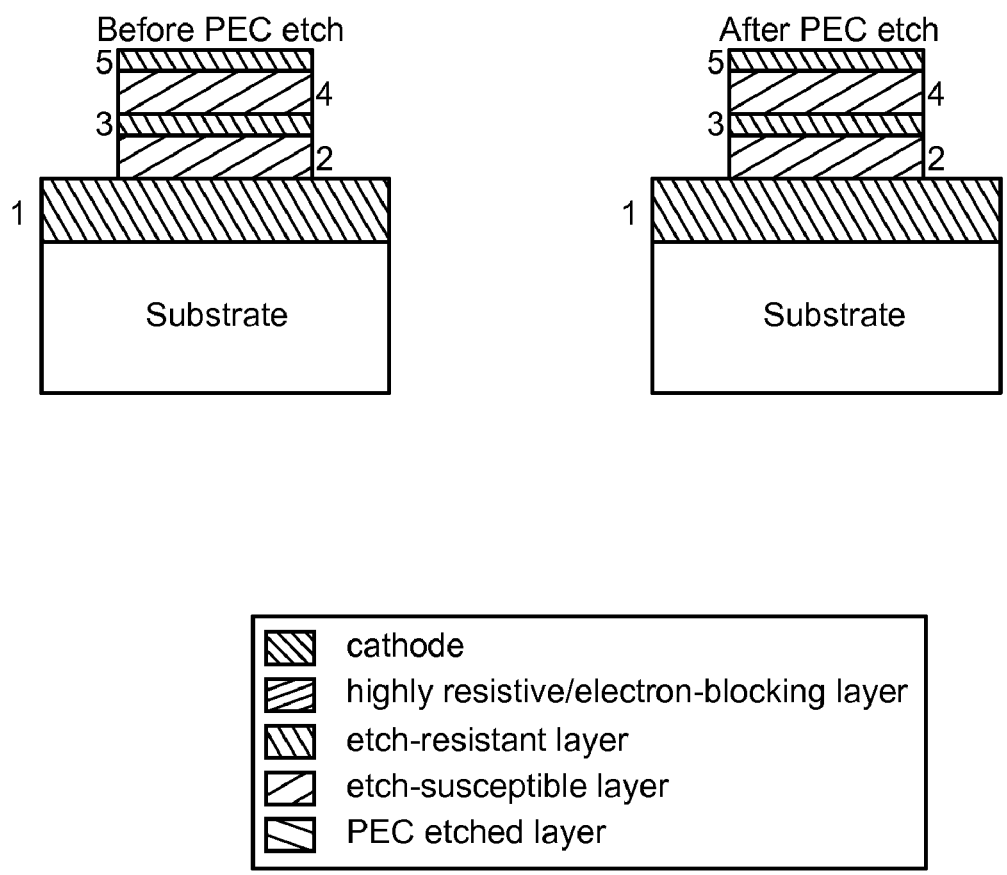

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

General Purpose

PEC etching is a viable method for producing specific geometries in the III-nitride material system, forming three-dimensional structures that would be extremely challenging to produce with gas-phase etching processes or more standard wet chemical etching. The existence of a controlled three-dimensional etch process can give rise to numerous useful device geometries. Specifically, an undercut geometry is desirable in several applications including but not limited to microdisk resonators, air-gap DBRs, semiconductor membranes and cantilevers, electrical and optical apertures, and in substrate removal.

Microdisk resonators typically show high-quality optical modes, and reduced optical and electrical lasing thresholds. The invention described herein provides a method for fabricating high-quality, "mushroom-shaped" microdisk resonators in the nitride semiconductor system.

Air-gap DBRs have several advantages over typical epitaxial or dielectric DBRs, including wider stopbands, higher reflectivity values per DBR period, and lower effective cavity lengths. They may be used as high-reflectivity mirrors in vertical cavity surface emitting lasers (VCSELs) and resonant cavity light emitting diodes (LEDs). This invention facilitates the fabrication of high-quality air-gap DBR structures in the nitride semiconductor system.

Semiconductor membranes are frequently used for a variety of applications including MEMS and photonic crystals. The nitrides offer unique optical and electrical material properties which are well suited for these applications. This invention enables the fabrication of membrane devices in the nitride material system.

Apertures are commonly used in several optoelectronic and electronic devices to reduce current spreading and to achieve better optical confinement. This invention may be used to effectively achieve apertures in the nitride semiconductor system.

Certain applications such as high-power LEDs require the removal of the substrate for improved heat extraction. This invention not only makes substrate removal possible, but also allows for precise thickness control of the sub-mounted structure such as in a microcavity LED.

This invention may therefore find application in practically all nitride-based electronic and optical devices.

Technical Description

This disclosure describes a method of locally controlling the etch rate and etch susceptibility of a semiconductor layer by manipulating photo-induced carrier dynamics within the layer through selective cathode placement relative to the layer and/or by incorporating highly resistive or electron-blocking layers into the semiconductor multilayer structure. The etch selectivity described above is achieved through appropriate choice of the following design elements. It is implicit that under the conditions considered, PEC etching is strictly a light-induced process. In the absence of light, no etching occurs in any of the layers.

1) Light source—This can be any light source (coherent or incoherent), filtered or unfiltered, which emits photons with energy greater than the bandgap energy of the "PEC etched" or "etch-susceptible" layers under the conditions considered.

2) PEC etched layer—This is a material layer which has a bandgap smaller than the energy of the incident light, is either n-type or unintentionally-doped, and which also has access to a conductive path for electrons, such that the photo-generated electrons can be collected before they recombine with the photo-generated holes, thereby allowing PEC etching to proceed in this layer under the conditions considered.

3) Etch-susceptible layer—This is a material layer which has a bandgap smaller than the energy of the incident light and is either n-type or unintentionally-doped, but does not have access to a conductive path for electrons, such that the photo-generated electrons and holes recombine before etching can occur under the conditions considered.

4) Etch-resistant layer—This is an electrically conductive material layer that either has a bandgap larger than the energy of the incident light or is p-type, such that is not etched under the conditions considered.

5) Highly resistive/electron-blocking layer—This is an electrically resistive material layer that either has a bandgap larger than the energy of the incident light or is p-type, such that is not etched under the conditions considered. Such a layer impedes the extraction of electrons from the "etch-susceptible" layers, thereby altering the carrier dynamics in the "etch-susceptible" layers to inhibit etching under the conditions considered.

6) Cathode—This is any highly conductive material that can be used to allow electrons to interact readily with the electrolyte under the conditions considered.

7) Electrolyte—This is an acidic or basic aqueous solution of the appropriate chemistry and concentration, which allows the appropriate reactions necessary for etching to occur in only the "PEC etched" layer, but has reaction rates slow enough to allow photo-generated electron-hole recombination to dominate in the "etch-susceptible" layer so as to reduce or prevent etching in this type of layer under the conditions considered.

The substrate for the semiconductor layer deposition can be any material compatible with the growth technique. The semiconductor material may be deposited on the substrate using any semiconductor growth method. The semiconductor material can include any well-designed combination of "etch-susceptible" layers, "etch-resistant" layers, "PEC etched" layers, or "highly resistive/electron-blocking" layers. The semiconductor material is suitably processed as required, using an etch to expose the "PEC etched" layer or layers. The cathode material is deposited and patterned on the material surface making contact with the appropriate layers so as to allow selective removal of only the "PEC etched" layer or layers.

In order to illustrate the basic principles of this invention, several example structures and their resulting etch profiles are presented in cross-sectional schematic views in FIGS. 1-8. These examples cover a range of layer configurations including structures with and without "highly resistive/electron-blocking layers", with various cathode placements. The etch selectivity is dependent on the photo-generated carriers, as well as the appropriate conduction path for photo-generated electrons. The inefficient removal of electrons slows or inhibits etching in layers in which photo-generated electron-hole pairs recombine faster than they are able to interact with the electrolyte.

The highly selective etch described in this invention is precisely controlled by the use of PEC etching in conjunction with local control of the electrochemical component of the etch process (through the use of "highly resistive/electron-blocking layers" and selective cathode placement), and cannot be achieved with bandgap selective PEC etching alone.

Preferred Embodiments

The examples in the preferred embodiment are limited to bandgap-selective lateral etching. However, the invention may also be applied to dopant-selective and/or defect-selective vertical and/or lateral PEC etching.

Figure 9:
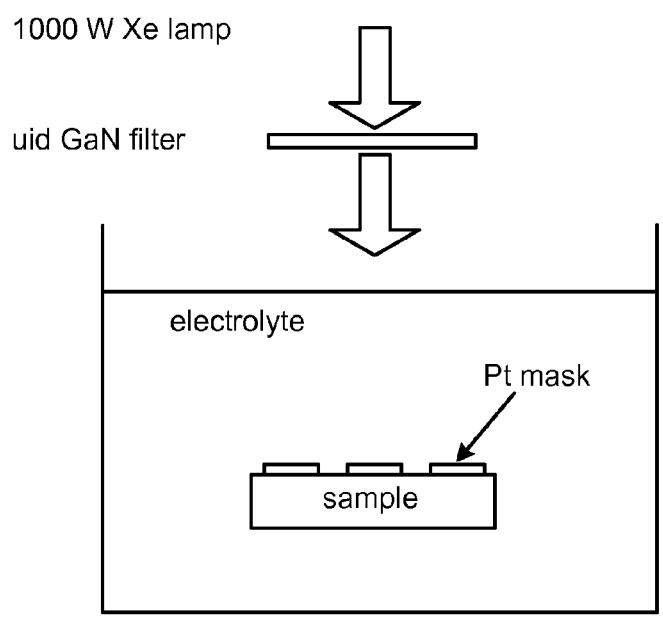
FIG. 9 is a schematic of the PEC etch set-up and includes two band diagrams illustrating the general principles of PEC etching (doping-selective and bandgap-selective)
Figure 9:
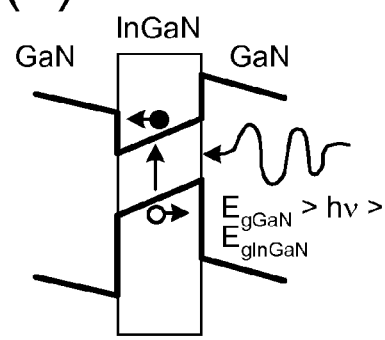
Figure 9:
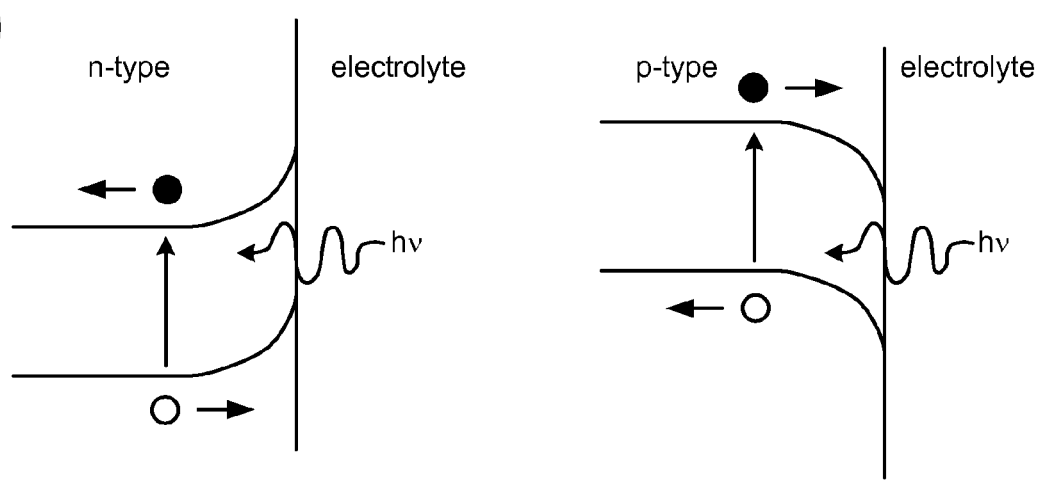

A schematic of the PEC etch set-up and two band diagrams illustrating the general principles of PEC etching (doping-selective and bandgap-selective) are shown in FIG. 9.

Two typical fabrication processes that yield the etching control and selectivity proposed in this disclosure are described below.

Microdisk Fabrication

Figure 10:
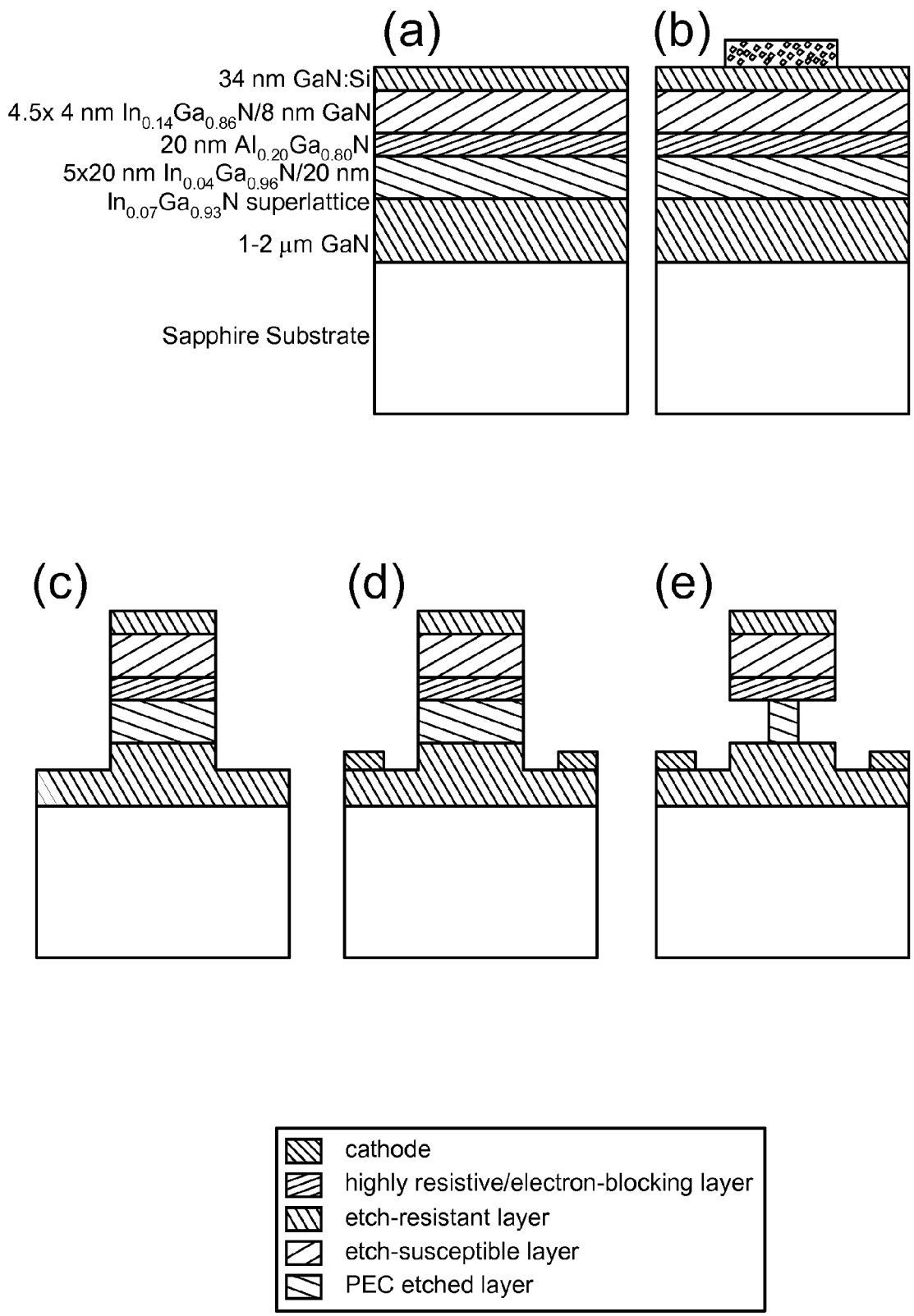
FIGS. 10(*a*)-(*e*) are cross-sectional schematics for each fabrication step used to make a microdisk.

In FIGS. 10(*a*)-(*e*) cross-sectional schematics are shown for each fabrication step used to make a microdisk.

1) The material structure is shown in FIG. 10(*a*). Each layer is labeled with material composition and doping, as well as layer type. The material structure is grown by metalorganic chemical vapor deposition (MOCVD) on a sapphire substrate.

2) As shown in FIG. 10(*b*), the material is masked with photoresist.

3) A chlorine-based reactive ion etching (RIE) step is used to transfer the photoresist pattern to the underlying material. The etch depth is approximately 440 nm, such that the entire thickness of the post region is exposed. Following the etch, the dry etch mask is removed. The dry-etched structure following mask removal is shown in FIG. 10(*c*).

4) The etched pillars are masked with 20 micron diameter concentric circles of photoresist, while the region on which the Pt is to be deposited is left bare.

5) 30 nm of Pt is deposited as a cathode using electron beam evaporation. A lift-off step is performed to remove the metal on top of and around the pillars, leaving Pt only in the field. The structure, following cathode deposition and lift-off, is shown in FIG. 10(*d*).

6) The pillar is undercut using PEC etching. The structure is placed in a 0.004 M HCl electrolytic solution, under a 1000 W Xe lamp. The light from the lamp is filtered with an unintentionally doped GaN filter, such that the output power density at 380 nm is 3.5 mW/cm2. The electrolyte solution is stirred during etching. A lateral etch rate of 25-35 nm/min is achieved under these conditions. The complete undercut device is shown in FIG. 10(*e*).

Figure 11:
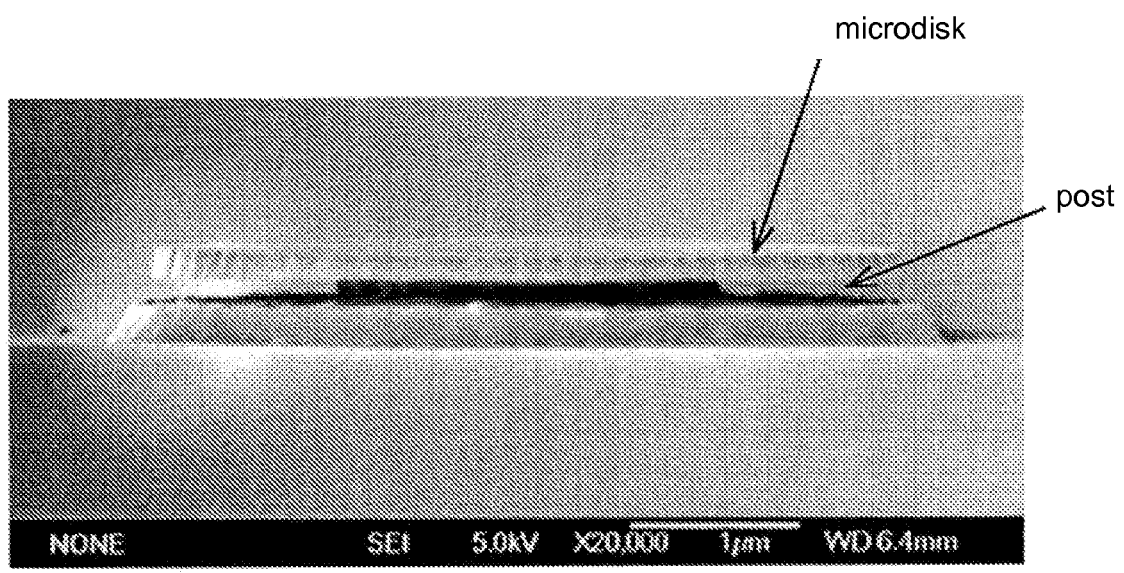
FIG. 11 is a scanning electron micrograph of the final microdisk structure.

A scanning electron micrograph of the final microdisk structure is shown in FIG. 11. Note that due to the presence of the $Al_{0.2}Ga_{0.8}N$ layer (or "highly resistive/electron-blocking" layer) we are able to selectively remove the post layer (or "PEC etched" layer), while leaving the lower-bandgap quantum well layers (or "etch-susceptible" layers) unetched.

Figure 12:
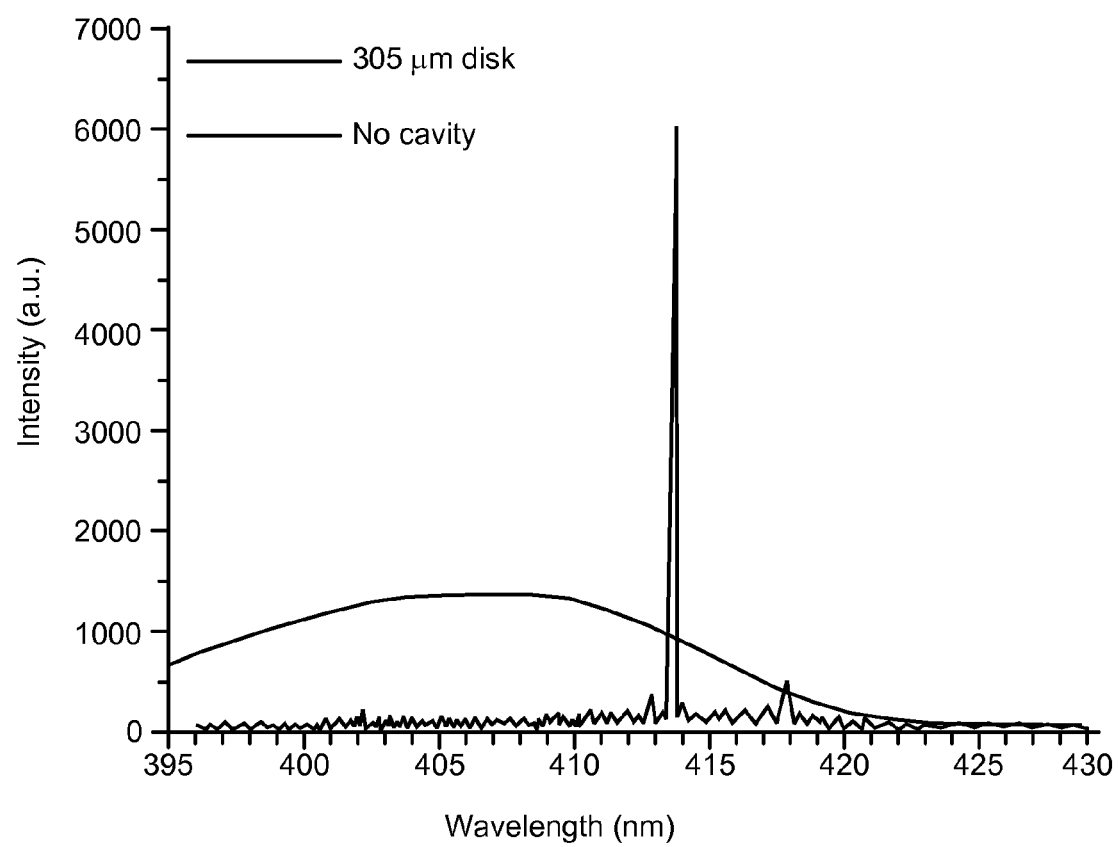
FIG. 12 includes photoluminescence spectra of unprocessed material and a 3.5 micron diameter microdisk.

Photoluminescence spectra of unprocessed material and a 3.5 micron diameter microdisk are shown in FIG. 12. The microdisk cavity created using the etching technique clearly still contains the quantum well active region. The FWHM (full-width half-maximum) of the emission peak is 0.1 nm and central wavelength is 414 nm, therefore a quality factor of about 4600 is achieved. This quality factor is much higher than previously reported measurements of nitride-based microdisks. Furthermore, we believe that we have observed lasing at optical pump power densities of greater than 12.1 $W/cm^2$.

Distributed Bragg Reflector (DBR) Fabrication

Figure 13:
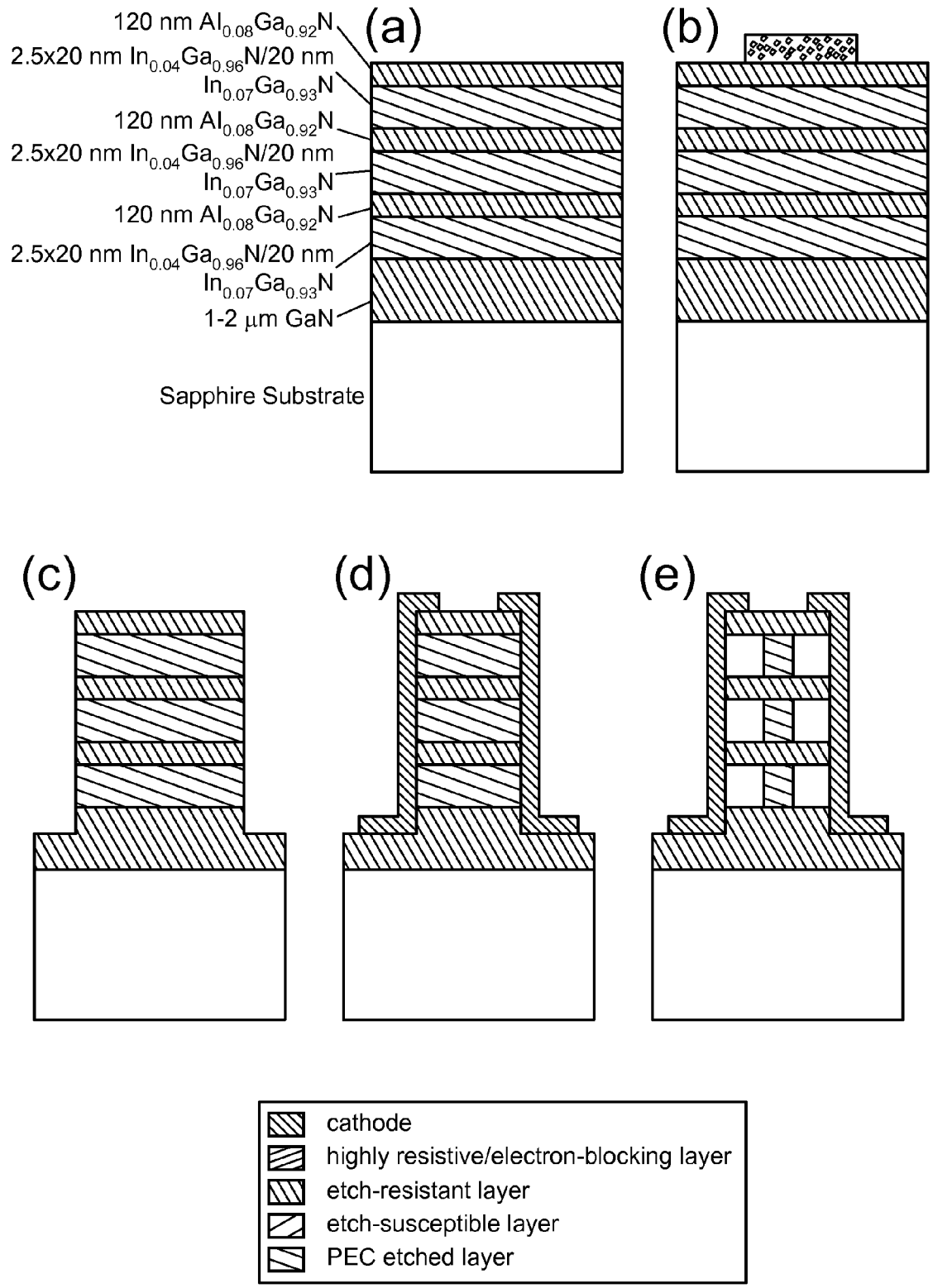
FIGS. 13(*a*)-(*e*) are cross-sectional schematics for each fabrication step used to make a vertically oriented DBR.

In FIGS. 13(*a*)-(*e*) cross-sectional schematics are shown for each fabrication step used to make a vertically oriented DBR.

1) The material structure is shown in FIG. 13(*a*). Each layer is labeled with material composition and doping, as well as layer type. The material structure is grown by MOCVD on a sapphire substrate.

2) As shown in FIG. 13(*b*), the material is masked with photoresist.

3) A chlorine-based RIE step is used to transfer the photoresist pattern to the underlying material. The etch depth is approximately 660 nm, such that the entire thickness of the post region is exposed. Following the etch, the dry etch mask is removed. The dry-etched structure following mask removal is shown in FIG. 13(*c*).

4) The pillars are masked with a striped photoresist pattern such that the openings in the photoresist are aligned to the centers of the pillars.

5) The cathode layers are deposited using angled, rotating electron beam evaporation. The cathode is a bilayer of metal consisting of 10 nm Ti and 300 nm Au. A lift-off step is performed leaving cathode material contacting the entire edge and sidewall of each pillar. The structure, following cathode deposition and lift-off, is shown in FIG. 13(d).

6) The structure is placed in a 0.004 M HCl electrolytic solution under a 1000 W Xe lamp. The light from the lamp is filtered with a wafer of unintentionally doped GaN such that the output power density at 380 nm is 3.5 mW/cm2. The electrolyte solution is stirred during etching. A lateral etch rate of 25-35 nm/min is achieved under these conditions. The complete undercut structure is shown in FIG. 13(e).

Figure 14:
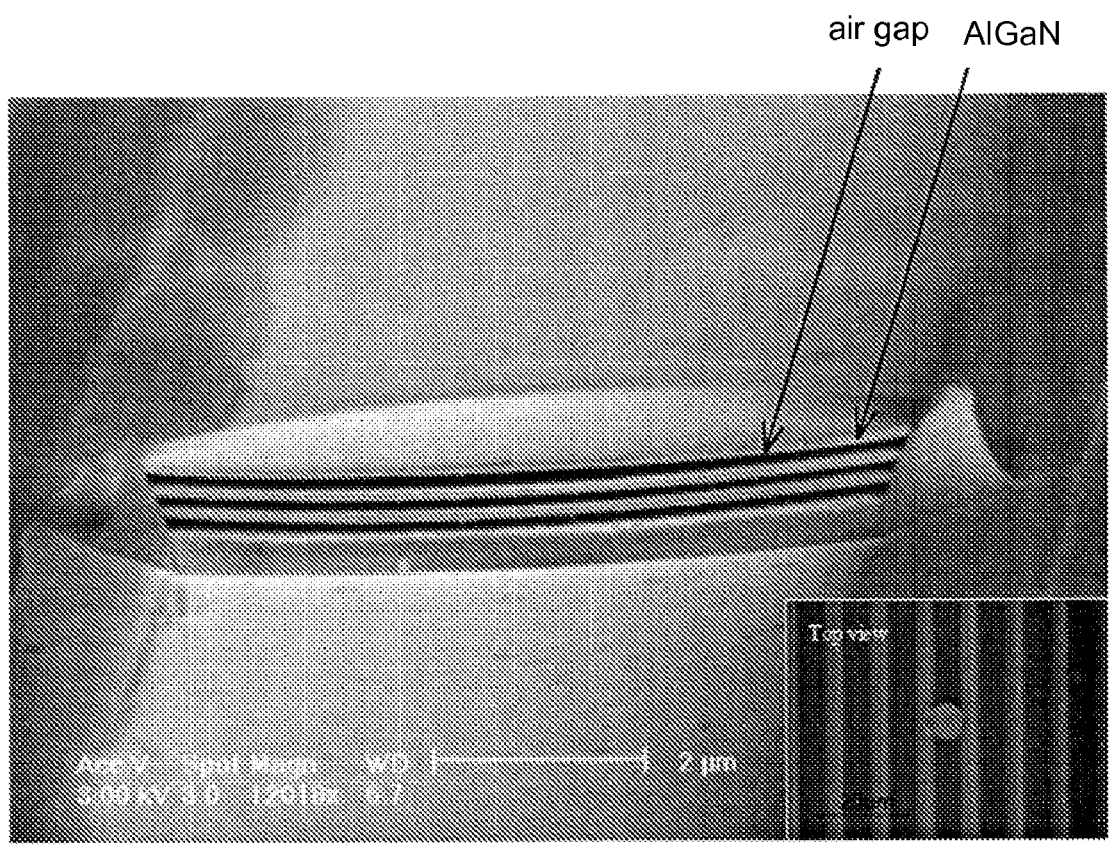
FIG. 14 is a scanning electron microscope (SEM) image of the final DBR structure.

A scanning electron microscope (SEM) image of the final DBR structure is shown in FIG. 14. Because the cathode was in direct contact with each of the "PEC etched" layers or the "etch-resistant" layers, each of these layers was etched to almost the same extent.

Possible Modifications and Variations

Above we have described two particular embodiments of the invention. Several modifications and variations that incorporate the essential elements of this invention are outlined below. Additionally, several alternate materials, conditions and techniques may be used in practice of this invention, as shall be enumerated below.

1) Alternate substrate materials, including but not limited to r-plane sapphire ($Al_2O_3$), c-plane silicon carbide (SiC), a-plane SiC, free-standing c-plane GaN, free-standing a-plane GaN, and epitaxial lateral overgrowth (ELOG) GaN on sapphire and SiC may be used.

2) Alternate epitaxial growth techniques, including but not limited to molecular beam epitaxy (MBE) and hydride vapor phase epitaxy (HVPE) may be used. Also, a variety of different growth conditions (precursor sources, gases, temperatures and pressures) may be employed for a given growth technique. Additionally, a wide range of compositions, dopant types and dopant concentrations may be used to produce the desired type of layer in the semiconductor structure.

3) Alternate techniques, including but not limited to ion implantation, thermal diffusion, and ion damage may be employed to create the desired type of layer (etch-susceptible, etched, etch resistant or highly resistive/electron-blocking) in the semiconductor structure.

4) Alternate etching techniques, including but not limited to ICP etching, PEC etching, and focused ion beam etching may be used to perform the vertical etch.

5) Alternate metals and combinations thereof (alloys or layered structures), metallic oxides, and degenerately doped layers may be employed to serve as the cathode during the bandgap-selective lateral PEC etching.

6) Alternate electrolytes (acids or bases) and concentrations thereof as well as any other oxidizing and reducing agents may be employed to carry out the bandgap-selective lateral PEC etching.

7) Alternate light sources including but not limited to various broad spectrum sources (with or without filters) and lasers may be employed to carry out the bandgap-selective lateral PEC etching.

Advantages and Improvements over Existing Practices

The advantages and improvements over existing practice, and the features believed to be new include the following:

1) This is believed to be the first invention that uses local control of the electrochemical component of PEC etching in order achieve a highly selective etch which cannot be achieved through PEC etching alone.

2) This invention permits the uniform etching of specific layers ("PEC etched" layers) in a semiconductor structure through controlled collection of photo-generated carriers, while other specific layers ("etch susceptible" layers) in the same structure are left unetched even though they may contain photo-generated carriers during PEC etching.

3) This invention has allowed for the fabrication of very high-quality "mushroom-shaped" microdisk resonators with quality factors orders of magnitude higher than previously reported in the nitride material system.

4) This invention has allowed for the fabrication of high-quality vertically oriented air-gap DBR structures, which have not been previously reported in the nitride material system.

5) This invention can also be used in several other applications including the fabrication of electrical and optical apertures, semiconductor membranes, cantilevers and photonic crystals, and for substrate removal in the nitride material system.

REFERENCES

The following references are incorporated by reference herein:

[1] Y. Gao, A. R. Stonas, I. Ben-Yaacov, U. Mishra, S. P. DenBaars, and E. L. Hu, "AlGaN/GaN current aperture vertical electron transistors fabricated by photoelectrochemical wet etching," Electronics Letters, vol. 39, pp. 148-9, 2003.

[2] A. R. Stonas, P. Kozodoy, H. Marchand, P. Fini, S. P. DenBaars, U. K. Mishra, and E. L. Hu, "Backside-illuminated photoelectrochemical etching for the fabrication of deeply undercut GaN structures," Applied Physics Letters, vol. 77, pp. 2610-12, 2000.

[3] A. R. Stonas, N. C. MacDonald, K. L. Turner, S. P. DenBaars, and E. L. Hu, "Photoelectrochemical undercut etching for fabrication of GaN microelectromechanical systems," AIP for American Vacuum Soc. Journal of Vacuum Science & Technology B, vol. 19, pp. 2838-41, 2001.

[4] A. R. Stonas, T. Margalith, S. P. DenBaars, L. A. Coldren, and E. L. Hu, "Development of selective lateral photoelectrochemical etching of InGaN/GaN for lift-off Applications", Applied Physics Letters, vol. 78, pp. 1945-7, 2001.

[5] R. P. Strittmatter, R. A. Beach, and T. C. McGill, "Fabrication of GaN suspended microstructures," Applied Physics Letters, vol. 78, pp. 3226-8, 2001.

[6] E. L. Hu and M. S. Minsky, "Photoelectrochemical wet etching of group III Nitrides". United States: The Regents of the University of California, 1996.

[7] E. L. Hu and A. R. Stonas, "Photoelectrochemical undercut etching of semiconductor material." United States, 2002.

[8] J. Bardwell, "Process for etching gallium nitride compound based semiconductors." United States: National Research Council of Canada, 2003.

[9] L.-H. Peng, C.-W. Chuang, J.-K. Ho, and Chin-Yuan, "Method for etching nitride." United States: Industrial Technology Research Institute, 1999.

[10] C. Youtsey, G. Bulman, and I. Adesida, "Dopant-selective photoenhanced wet etching of GaN", TMS. Journal of Electronic Materials, vol. 27, pp. 282-7, 1998.

[11] T. Margalith, L. A. Coldren, and S. Nakamura, "Implantation for current confinement in nitride-based vertical optoelectronics." United States, 2002.

[12] I. Ben-Yaacov, Y. K. Seck, S. Heikman, S. P. DenBaars, and U. K. Mishra, "AlGaN/GaN current aperture vertical electron transistors", Device Research Conference (Cat. No. 02TH8606). IEEE. 2002, pp. 31-2.

[13] W. S. Wong, Y. Cho, E. R. Weber, T. Sands, K. M. Yu, J. Kruger, A. B. Wengrow, and N. W. Cheung, "Structural and optical quality of GaN/metal/Si heterostructures fabricated by excimer laser lift-off," Applied Physics Letters, vol. 75, pp. 1887-9, 1999.

[14] W. S. Wong, T. Sands, and N. W. Cheung, "Damage-free separation of GaN thin films from sapphire substrates", Applied Physics Letters, vol. 72, pp. 599-601, 1998.

[15] P. R. Edwards, R. W. Martin, H. S. Kim, K. S. Kim, Y. Cho, I. M. Watson, T. Sands, N. W. Cheung, and M. D. Dawson, "InGaN/GaN quantum well microcavities formed by laser lift-off and plasma etching", Wiley-VCH. Physica Status Solidi B-Basic Research, vol. 228, pp. 91-4, 2001.

[16] R. W. Martin, P. R. Edwards, H. S. Kim, K. S. Kim, T. Kim, I. M. Watson, M. D. Dawson, Y. Cho, T. Sands, and N. W. Cheung, "Optical spectroscopy of GaN microcavities with thicknesses controlled using a plasma etchback," Applied Physics Letters, vol. 79, pp. 3029-31, 2001.

[17] R. W. Martin, H. S. Kim, Y. Cho, P. R. Edwards, I. M. Watson, T. Sands, N. W. Cheung, and M. D. Dawson, "GaN microcavities formed by laser lift-off and plasma Etching", Materials Science & Engineering B-Solid State Materials for Advanced Technology, vol. B93, pp. 98-101, 2002.

[18] A. R. Stonas, "Gallium Nitride-Based Micro-Opto-Electro-Mechanical Systems", in Electrical and Computer Engineering Department. Santa Barbara: University of California, Santa Barbara, 2003, pp. 132.

APPENDICES

Further information on the present invention can be found in the attached Appendices:

Appendix A—Abstract and presentation slides by E. D. Haberer, R. Sharma, C. Meier, A. R. Stonas, S. P. DenBaars, S. Nakamura, and E. L. Hu, "Optical Modes in Mushroom-Shaped GaN/InGaN Microdisk Resonators Fabricated Using Photoelectrochemical Etching", Electronic Materials Conference (EMC), June 2004, Notre Dame, Ind.

Appendix B—Abstract, proceedings paper and presentation slides by E. D. Haberer, C. Meier, R. Sharma, A. R. Stonas, S. P. DenBaars, S. Nakamura, and E. L. Hu, "Observation of high Q resonant modes in optically pumped GaN/InGaN microdisks fabricated using photoelectrochemical etching," International on Workshop Nitride Semiconductors (IWNS), July 2004, Pittsburgh, Pa.

Appendix C—Manuscript by E. D. Haberer, R. Sharma, C. Meier, A. R. Stonas, S. Nakamura, S. P. DenBaars, and E. L. Hu, "Free-standing, optically-pumped, GaN/InGaN microdisk lasers fabricated by photoelectrochemical etching," submitted for publication in Applied Physics Letters in June 2004.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a III-nitride semiconductor structure comprising:
   modifying an electrochemical potential of material in the semiconductor structure relative to an electrolyte to perform a selective photo-induced etch of the material, by:
   (1) impeding extraction of photo-generated electrons from the material to inhibit etching of the material, or
   (2) collecting photo-generated electrons from the material to promote etching of the material.

2. The method of claim 1, wherein the modifying step further comprises performing a suitable placement of one or more electrically resistive (unintentionally-doped, doped or alloyed) or electron-blocking layers in the semiconductor structure.

3. The method of claim 1, wherein the modifying step further comprises selectively placing a cathode for the photo-induced etch, wherein the cathode is a channel for controlled collection of the photo-generated electrons from semiconductor layers with which it is in contact.

4. The method of claim 1, wherein the modifying step further comprises using a suitable light source during the photo-induced etch, which enables photo-generation of electrons and holes in layers with bandgap energies lower than the energy of incident light, to create the photo-generated electrons.

5. The method of claim 1, wherein the modifying step further comprises using a suitable electrolyte solution during the photo-induced etch, wherein the electrolyte's concentration and type determines etch rate and etch selectivity.

6. The method of claim 1, wherein the semiconductor structure comprises a nitride-based microdisk resonator.

7. The method of claim 1, wherein the semiconductor structure comprises a vertically oriented nitride-based air-gap distributed Bragg reflector (DBR) structure.

8. A method for locally controlling an electrical potential of a semiconductor structure or device, and hence locally controlling lateral, vertical, or a combination of both lateral and vertical, photoelectrochemical (PEC) etch rates, by appropriate placement of one or both of the following:
   (1) one or more electrically resistive layers or layers that impede electron flow from one or more etch susceptible layers within the semiconductor structure or device, to inhibit etching of the etch susceptible layers, and
   (2) a cathode in contact with one or more layers to be etched of the semiconductor structure or device during PEC etching, wherein the cathode is a channel for controlled collection of photo-generated electrons from the layers, thereby promoting etching of the layers.

* * * * *